US008866172B2

(12) United States Patent
Katayama

(10) Patent No.: US 8,866,172 B2
(45) Date of Patent: Oct. 21, 2014

(54) LIGHT EMITTING ELEMENT AND IMAGE DISPLAY APPARATUS USING THE LIGHT EMITTING ELEMENT

(75) Inventor: Ryuichi Katayama, Minato-ku (JP)

(73) Assignee: NEC Corporation, Tokyo (JP)

( * ) Notice: Subject to any disclaimer, the term of this patent is extended or adjusted under 35 U.S.C. 154(b) by 25 days.

(21) Appl. No.: 13/503,212

(22) PCT Filed: Oct. 6, 2010

(86) PCT No.: PCT/JP2010/067542
§ 371 (c)(1),
(2), (4) Date: Apr. 20, 2012

(87) PCT Pub. No.: WO2011/048952
PCT Pub. Date: Apr. 28, 2011

(65) Prior Publication Data
US 2012/0199855 A1    Aug. 9, 2012

(30) Foreign Application Priority Data
Oct. 22, 2009    (JP) ................................. 2009-243432

(51) Int. Cl.
*H01L 33/60*    (2010.01)
(52) U.S. Cl.
USPC .................. 257/98; 257/88; 257/778; 349/96; 349/114
(58) Field of Classification Search
CPC ..... H01L 33/58; H01L 33/465; H01L 33/405; H01L 33/44; H01L 25/0753; H01L 33/46; G02B 27/102; G02B 27/283
See application file for complete search history.

(56) References Cited

U.S. PATENT DOCUMENTS 5,327,285 A * 7/1994 Faris ........................ 359/486.02
6,785,320 B1 * 8/2004 Amos et al. .................... 372/102
(Continued)

FOREIGN PATENT DOCUMENTS

CN    1949552 A    4/2007
JP    2001-051122 A    2/2001
(Continued)

OTHER PUBLICATIONS

Christian Hoepfner, "Invited Paper: PhlatLight™ Photonic Lattice LEDs for RPTV Light Engines", SID Digest, 2006, pp. 1808-1811.

(Continued)

*Primary Examiner* — Hrayr A Sayadian
(74) *Attorney, Agent, or Firm* — Sughrue Mion, PLLC

(57) ABSTRACT

The present invention is intended to realize a light emitting element which is easy to fabricate, is efficient, and is able to emit light in a uniform polarization state enabling the achievement of high luminance. A light emitting element of the present invention is a light emitting element including an active layer for generating light, the light emitting element including: a first reflection layer that allows the light generated at the active layer to reflect at a reflection section in which reflection members are periodically provided, and to exit from an exiting section between the reflection members; a polarization beam splitter layer that transmits a polarized light oriented in a first direction and diffracts a polarized light oriented in a second direction orthogonal to the first direction among the light exited from the exiting section; a wave plate layer that allows the light transmitted through the polarization beam splitter layer and the light diffracted at the polarization beam splitter layer to enter, and to exit as a light of a same polarization state; and a second reflection layer that reflects the light reflected at the first reflection light.

9 Claims, 12 Drawing Sheets

(a)

(b)

(56) References Cited

U.S. PATENT DOCUMENTS

| | | |
|---|---|---|
| 8,643,050 B2* | 2/2014 | Katayama .................. 257/98 |
| 2002/0145689 A1* | 10/2002 | Kaneko .................... 349/114 |
| 2003/0090607 A1* | 5/2003 | Kamijo ..................... 349/96 |
| 2004/0070829 A1* | 4/2004 | Kurtz et al. .............. 359/486 |
| 2005/0205884 A1* | 9/2005 | Kim et al. ................. 257/98 |
| 2005/0213310 A1* | 9/2005 | Takeda ..................... 362/19 |
| 2005/0224826 A1 | 10/2005 | Keuper et al. |
| 2006/0215129 A1* | 9/2006 | Alasaarela et al. ......... 353/94 |
| 2006/0238716 A1* | 10/2006 | Lee et al. ................. 353/20 |
| 2006/0262397 A1* | 11/2006 | Lee et al. ................ 359/486 |
| 2007/0081253 A1 | 4/2007 | Yamauchi |
| 2007/0268490 A1* | 11/2007 | Kawakami et al. ......... 356/365 |
| 2008/0054283 A1 | 3/2008 | Min et al. |
| 2012/0217529 A1* | 8/2012 | Katayama .................. 257/98 |
| 2013/0021774 A1* | 1/2013 | Katayama ................... 362/19 |

FOREIGN PATENT DOCUMENTS

| | | |
|---|---|---|
| JP | 2001-215444 A | 8/2001 |
| JP | 2003-504880 A | 2/2003 |
| JP | 2005-328042 A | 11/2005 |
| JP | 2006-165423 A | 6/2006 |
| JP | 2007-109689 A | 4/2007 |
| JP | 2008-060534 A | 3/2008 |
| JP | 2009-111012 A | 5/2009 |
| JP | 2009-117641 A | 5/2009 |
| JP | 2009-239075 A | 10/2009 |
| WO | 2007/108212 A1 | 9/2007 |

OTHER PUBLICATIONS

Office Action dated Mar. 4, 2014, issued by the State Intellectual Property of the P.R.C. in corresponding Chinese Application No. 201080047464.8.

* cited by examiner (a)

(b)

LIGHT EMITTING ELEMENT AND IMAGE DISPLAY APPARATUS USING THE LIGHT EMITTING ELEMENT

CROSS REFERENCE TO RELATED APPLICATIONS

This application is a National Stage of International Application No. PCT/JP2010/067542 filed on Oct. 6, 2010, which claims priority from Japanese Patent Application No. 2009-243432, filed on Oct. 22, 2009, the contents of all of which are incorporated herein by reference in their entirety.

TECHNICAL FIELD

The present invention relates to a light emitting element that emits light in a uniform polarization state, and an image display apparatus using the light emitting element.

BACKGROUND ART

There is proposed an image display apparatus in which a light emitting diode (LED) is used as the light emitting element. Such a type of image display apparatus is configured to include: a plurality of LEDs that emit each color of red (R), green (G), and blue (B); an illumination optical system into which lights from the plurality of LEDs are made to enter; a light valve having a liquid crystal display board into which the light from the illumination optical system enters; a color synthesis prism that synthesizes the light from the light valve; and a projection optical system for projecting the light from the color synthesis prism to a projection plane.

In an image display apparatus having the above-described configuration, it is desired that optical loss in the optical path from the light emitting element to the light valve is reduced as much as possible to increase the luminance of a projected picture.

Among the above-described components, the liquid crystal display board and the color synthesis prism have a polarization dependence, and to increase the efficiency of the optical system, it is desired that the light emitting element emit light in a uniform polarization state.

Moreover, as described in Non Patent Literature 1, there is restriction by etendue which is determined by the product of the area and the radiation angle of the light emitting element. That is, unless the value of the product of the light emission area and radiation angle of the light emitting element is made equal to or less than the value of the product of the area of incident surface of the light valve and an acceptance angle (solid angle) determined by the F number of the illumination optical system, the light from the light emitting element will not be utilized as the projection light.

For that reason, in an image display apparatus using LEDs, the issue is to reduce the optical loss described above without increasing the emission surface of the light emitting element in order to reduce the etendue of the emitted light of the light emitting element.

Patent Literature 1 (JP2009-111012A) discloses a semiconductor light emitting apparatus in which the surface orientation of the growth principal surface is prescribed for the purpose of achieving light emission having a large polarization ratio.

Patent Literature 2 (JP2007-109689A) discloses a light emitting element, which has as its object providing a light emitting element or the like capable of reducing etendue and supplying light with a high polarization conversion efficiency, and includes a light emitting section that is provided on a reference surface and supplies light, and a structure provided at the emission side of the light emitting section, wherein the structure includes a reflective polarizing plate that transmits polarized light in a first vibration direction, and reflects polarized light in a second vibration direction nearly orthogonal to the first vibration direction, and an optical section that transmits light from the reflective polarizing plate and is formed such that a refractive index changes periodically with respect to a two-dimensional direction substantially parallel with the reference surface.

Patent Literature 3 (JP2006-165423A) discloses, in an embodiment shown in FIG. 21 thereof, an arrangement which allows light, which is generated at a light emitting layer and which is made to exit from between upper side electrode layers, to enter a polarization separation film, which transmits a P-polarized component and reflects an s-polarized component, via a microlens element, and allows the reflected S-polarized component to reflect in the same direction as that of the light of P-polarized component by means of a reflection film, and to enter an a half-wavelength plate, thereby achieving a light with the same polarization orientation as that of the light of the P-polarized component.

CITATION LIST

Patent Literature

[Patent Literature 1] JP2009-111012A
[Patent Literature 2] JP2007-109689A
[Patent Literature 3] JP2006-162354A
[Patent Literature 4] JP2001-51122A

Non Patent Literature

[Non Patent Literature 1] SID 06 DIGEST, 2006, pp. 1808-1811, 61.1, Photonic Lattice LEDs for RPTV Light Engines, Christian Hoepfner

SUMMARY OF INVENTION

Technical Problem

Since the semiconductor light emitting apparatus described in Patent Literature 1 uses the surface orientation of a growth principal surface, its growth condition is limited and this will lead to productivity issues. This will cause a problem especially when a substrate having a large area is used.

While the light emitting element described in Patent Literature 2 uses a reflective polarization plate to align the polarization orientation of the light to be emitted therefrom, since the light reflected by the reflective polarizing plate is configured to change its vibration direction at a reflection section and since a phase plate is provided closer to the light emitting section than the reflective polarizing plate and since light reenter the reflective polarizing plate, there is a problem in that the efficiency of polarization conversion is poor when considering the attenuation in the reflection, and achieving a high luminance is difficult.

The arrangement disclosed in Patent Literature 3 is provided with a polarization separation film corresponding to the light which is generated at a light emitting layer and which is made to exit from between upper electrode layers. From among the light generated at the light emitting layer, only a small part thereof directly exits from between the upper side electrode layers and a major part thereof exits after being reflected. Since as the number of reflections increases, attenuation occurs according to the number thereof, the installation interval of the upper side electrodes has to be made small. For this reason, the polarization separation film corresponding to the upper side electrode layer has to be made small as well, making the fabrication thereof difficult.

The present invention has been made in view of the problems of such related arts as described above, and its object is to realize a light emitting element which is easy to fabricate, good in efficiency, and able to emit light in a uniform polarization state, thus enabling the achievement of high luminance.

Solution to Problem

A light emitting element of the present invention is a light emitting element including an active layer for generating light, the light emitting element including:

a first reflection layer that allows the light generated at the active layer to reflect at a reflection section in which reflection members are periodically provided, and to exit from an exiting section between the reflection members;

a polarization beam splitter layer that transmits polarized light oriented in a first direction and diffracts polarized light oriented in a second direction orthogonal to the first direction among the light exited from the exiting section;

a wave plate layer that allows the light transmitted through the polarization beam splitter layer and the light diffracted at the polarization beam splitter layer to enter, and to exit as light of a same polarization state; and a second reflection layer that reflects the light reflected at the first reflection light.

An image display apparatus of the present invention utilizes the light emitting element of the above-described configuration.

Advantageous Effects of Invention

In the present invention, a polarized light oriented in a first direction and a polarized light oriented in a second direction orthogonal to the first direction are made to exit from the polarization beam splitter layer. Since these polarized lights are thereafter made to exit, without being reflected, as a light in the same polarization state at the wave plate layer, they are efficient and can achieve a high luminance. Moreover, since the polarization beam splitter layer has a flat plate shape, even if the installation interval of the reflection members is reduced, it can be provided accordingly and therefore is easy to fabricate.

DESCRIPTION OF EMBODIMENTS

Figure 1:
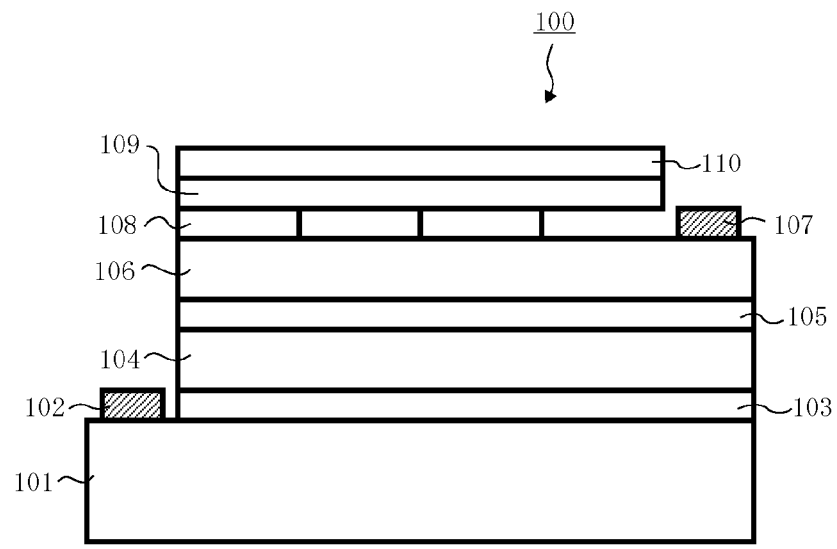
FIG. 1(a) is a cross-sectional view showing the configuration of an exemplary embodiment of light emitting element 100.
FIG. 1(b) is a cross-sectional view showing the configuration of a principal part thereof.
Figure 1:
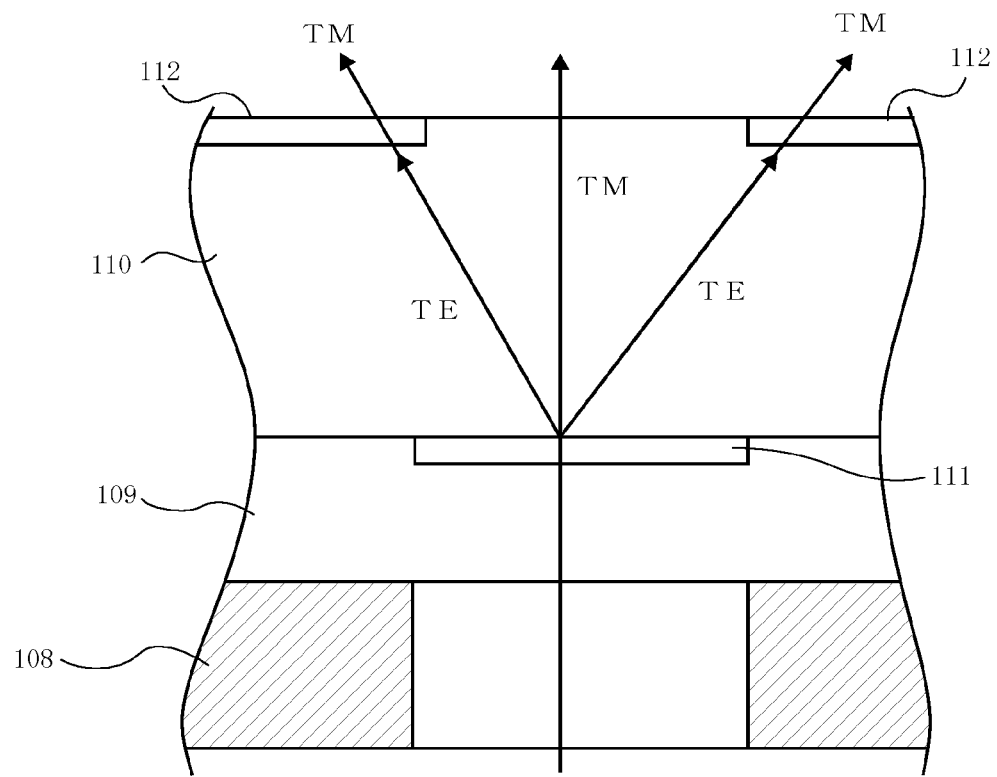

Hereafter, specific exemplary embodiments will be described with reference to the drawings.

FIG. 1(a) is a cross-sectional view showing the configuration of an exemplary embodiment of light emitting element 100, and FIG. 1(b) is a cross-sectional view showing the configuration of a principal part thereof. It is noted that in light emitting element 100, since the actual thicknesses of individual layers are very thin and the differences in the thickness between respective layers are large, it is difficult to draw a picture of each layer at an accurate scale and proportion. Accordingly, each layer is not drawn to an actual scale in the drawings, and instead, each layer is schematically shown.

P-type electrode 102 made up of Ni/Au/Ti/Au and reflection layer 103 made up of Ag are formed on submount 101 which is made of Si.

P-type semiconductor layer 104 which is made of GaN doped with Mg, active layer 105 in which GaN and InGaN are alternately stacked to constitute a multiple quantum well (MQW), and N-type semiconductor layer 106 which is made of GaN doped with Si are stacked in order on reflection layer 103. N-type electrode 107 made up of Ti/Al/Ti/Au, and reflection layer 108 which is made of Ag are formed on N-type semiconductor layer 106, and further polarization beam splitter layer 109 and half-wave plate layer 110 are provided on reflection layer 108.

The method of fabricating light emitting element 100 will be described. First, N-type semiconductor layer 106, active layer 105, P-type semiconductor layer 104, and reflection layer 103 are formed on a substrate. Next, reflection layer 103 is bonded to submount 101 to remove the substrate. Next, reflection layer 108 is formed on N-type semiconductor layer 106. Polarization beam splitter layer 109 and half-wave plate layer 110 are formed by a separate process, and bonded onto reflection layer 108. Lastly, P-type electrode 102 and N-type electrode 107 are formed.

The outline operation of the present exemplary embodiment will be described. Applying a voltage between P-type electrode 102 and N-type electrode 107 to pass an electric current between them will result in the generation of light at active layer 105. The light generated at active layer 105 contains components which are oriented toward various directions.

Reflection layer 108 is made up of a portion that reflects the light generated at active layer 105 and a portion that allows the light generated at active layer 105 to exit. Both polarization beam splitter layer 109 and half-wave plate layer 110 respectively include a first region and a second region, and each of these regions is provided so as to correspond to a reflection section and an exiting section in reflection layer 108.

As shown in FIG. 1(b), polarization beam splitter layer 109 is provided with polarizing diffraction grating 111 in a region corresponding to the exiting section of reflection layer 108. Moreover, half-wave plate layer 110 is provided with half-wave plate 112 in a region corresponding to the reflection section of reflection layer 108.

Polarizing diffraction grating 111 is configured to transmit a polarized wave oriented in a first direction (for example, TM wave), and diffracts a polarized wave oriented in a second direction (for example, TE wave), which is orthogonal to the first direction, to a predetermined direction, and in the case of the present exemplary embodiment, it diffracts the polarized wave oriented in the second direction toward half-wave plate 112.

Half-wave plate 112 allows the incident polarized wave oriented in the second direction to exit as a polarized wave oriented in the first direction. As a result of this, light of a polarized wave oriented in the first direction will be made to exit from both of the portions, where half-wave plate 112 is provided and where half-wave plate 112 is not provided, of half-wave plate layer 110.

Hereafter, specific configurations of reflection layer 108, polarization beam splitter layer 109, and half-wave plate layer 110 will be described.

Figure 2:
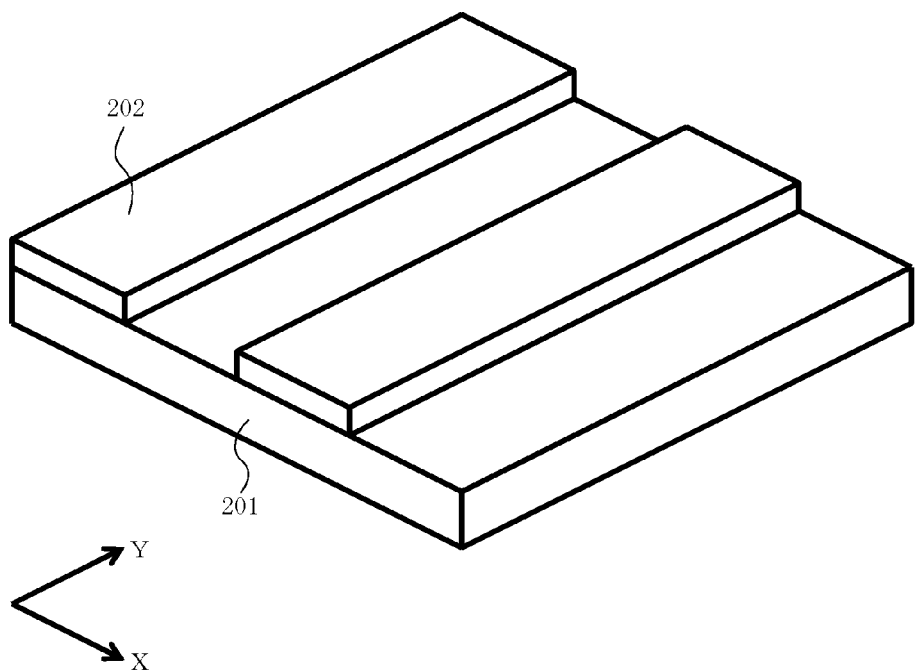
FIG. 2 is a perspective view showing one configuration example of reflection layer 108 in FIG. 1.

FIG. 2 is a perspective view showing one configuration example of reflection layer 108 in FIG. 1.

In the example shown in FIG. 2, a plurality of reflection members 202 having a longitudinal shape and made of Ag are formed in parallel on N-type semiconductor layer 201 which is made of GaN doped with Si. The portion provided with reflection member 202 serves as a reflection section, and the portion not provided with reflection member 202 serves as an exiting section.

Figure 3:
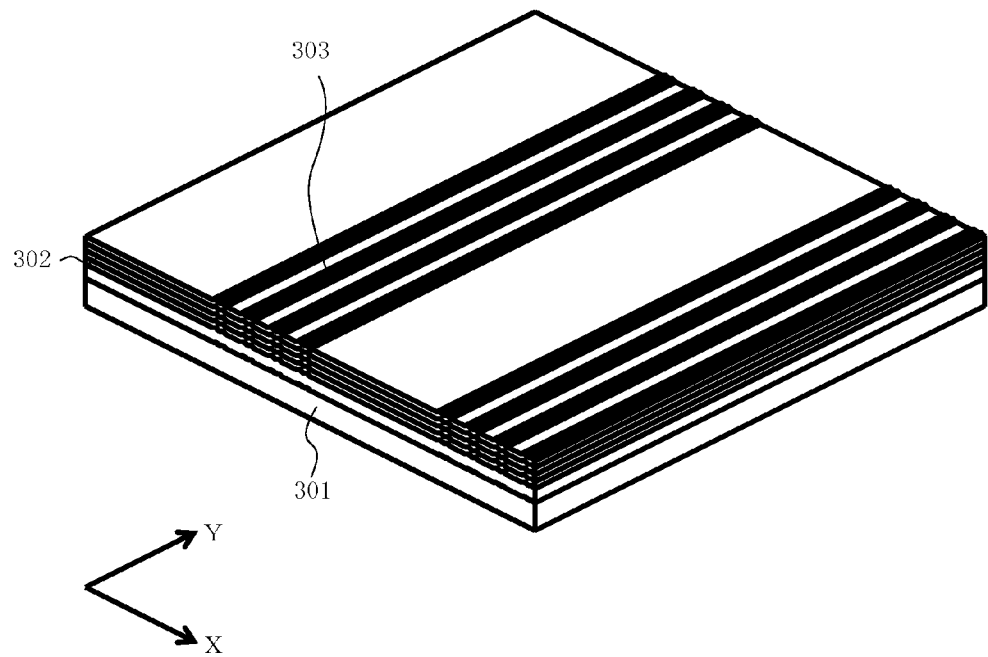
FIG. 3 is a perspective view showing one configuration example of polarization beam splitter layer 109 in FIG. 1.
Figure 4:
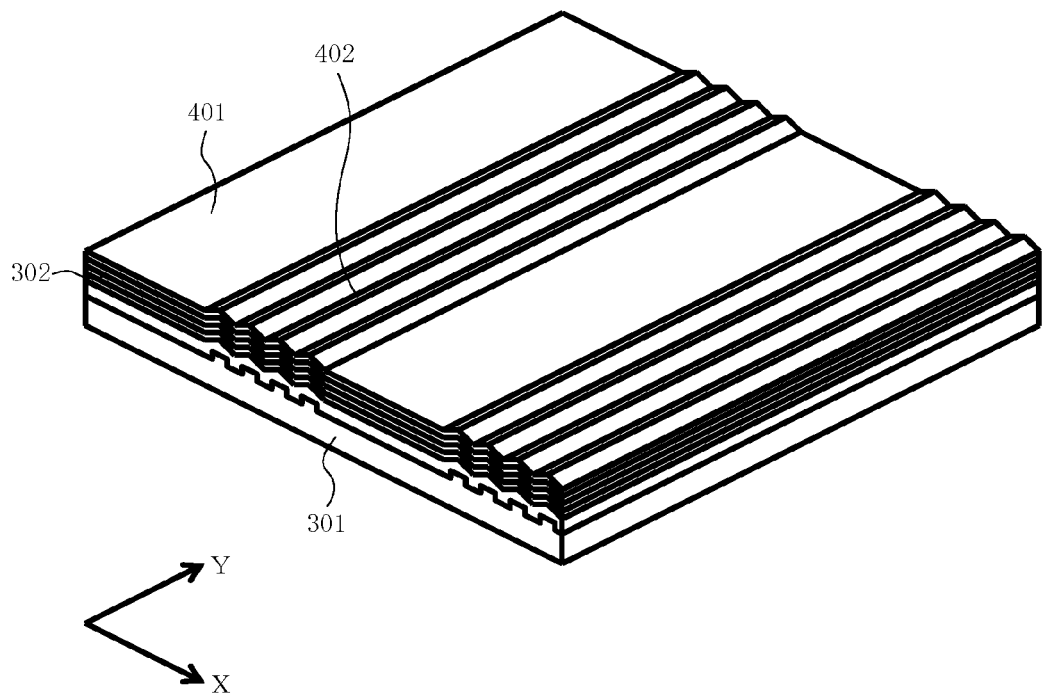
FIG. 4 is a perspective view showing one configuration example of polarization beam splitter layer 109 in FIG. 1.

FIG. 3 is a perspective view showing one configuration example of polarization beam splitter layer 109 in FIG. 1, and FIG. 4 is a perspective view showing the configuration more specifically.

In the example shown in FIGS. 3 and 4, dielectric 302 in which $SiO_2$ and $TiO_2$ are alternately stacked is formed on substrate 301 which is made of quartz. The flat portion where polarizing diffraction grating 303 is not provided as shown in FIG. 3 corresponds to the reflection section of reflection layer 108, and the portion where polarizing diffraction grating 303 is provided corresponds to the exiting section of reflection layer 108.

FIG. 4 is an enlarged view of the portion where polarizing diffraction grating 303 is provided. Polarizing diffraction grating 303 is alternately provided with first region 401 which is formed into a flat shape, and second region 402 which has a periodic structure having a periodic concavo-convex shape in one direction and a uniform shape in the direction orthogonal to the above-described one direction with respect to the XY plane as disclosed in Patent Literature 4 (JP2001-51122A), and works as a polarization-dependent phase diffraction grating.

Figure 5:
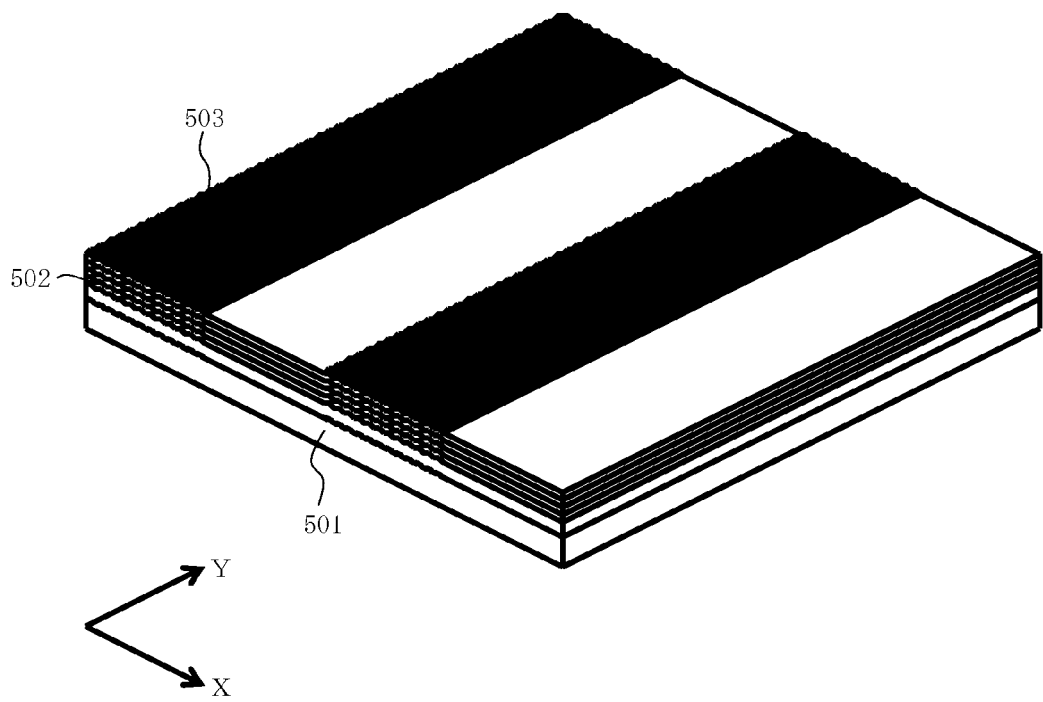
FIG. 5 is a perspective view showing one configuration example of half-wave plate layer 110 in FIG. 1.
Figure 6:
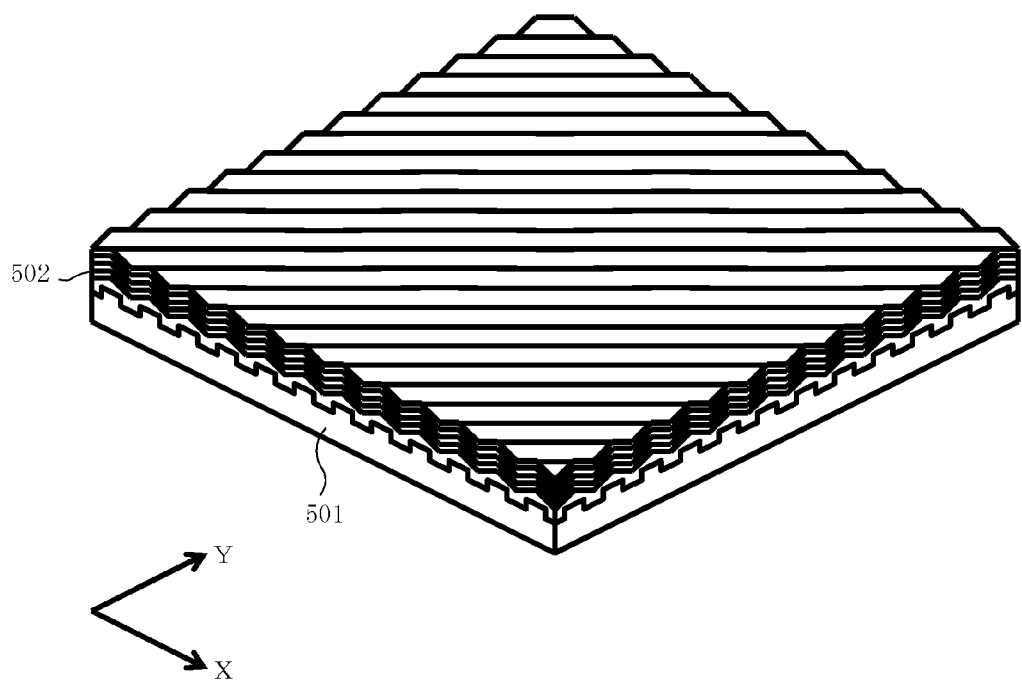
FIG. 6 is a perspective view showing one configuration example of half-wave plate layer 110 in FIG. 1.

FIG. 5 is a perspective view showing one configuration example of half-wave plate layer 110 in FIG. 1, and FIG. 6 is a perspective view showing the configuration more specifically.

In the example shown in FIGS. 5 and 6, dielectric 502 in which $SiO_2$ and $TiO_2$ are alternately stacked is formed on substrate 501 which is made of quartz. The portion where half-wave plate 503 is provided as shown in FIG. 5 corresponds to a reflecting section of reflection layer 108, and the flat portion where half-wave plate 503 is not provided corresponds to an exiting section of reflection layer 108.

FIG. 6 is an enlarged view of a portion where half-wave plate 503 is provided. Half-wave plate 503 has a periodic structure which has a periodic concavo-convex shape in one direction and a uniform shape in the direction orthogonal to the one direction with respect to XY plane as disclosed in JP2001-51122A.

Figure 7:
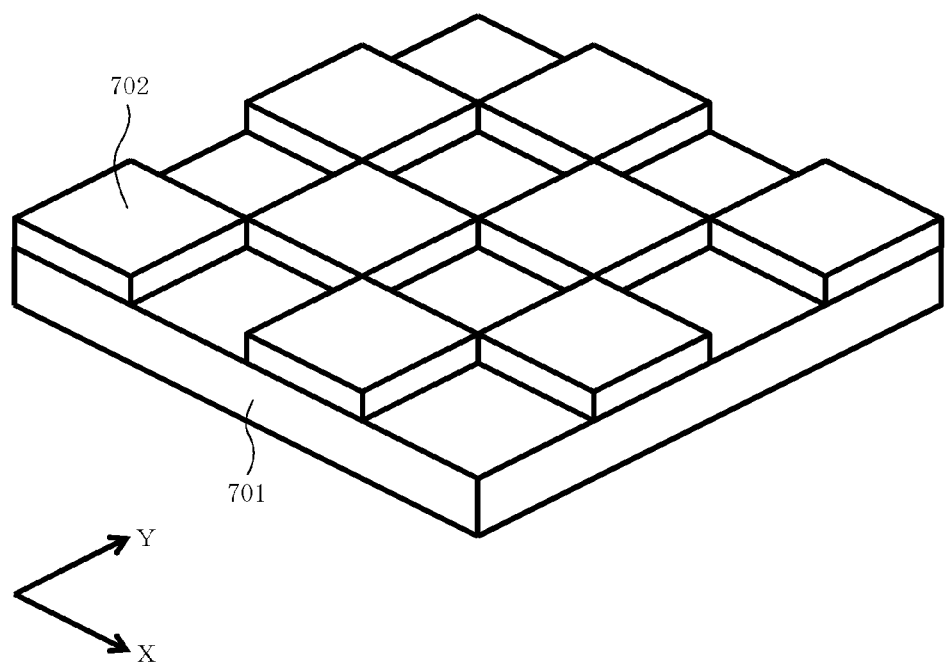
FIG. 7 is a perspective view showing another configuration example of reflection layer 108 in FIG. 1.

FIG. 7 is a perspective view showing another configuration example of reflection layer 108 in FIG. 1.

In the example shown in FIG. 7, rectangular reflection member 702 which is made of Ag is formed in a staggered pattern on N-type semiconductor layer 701 which is made of GaN doped with Si. A portion where reflection member 707 is provided constitutes a reflection section, and a portion where reflection member 702 is not provided constitutes an exiting section.

Figure 8:
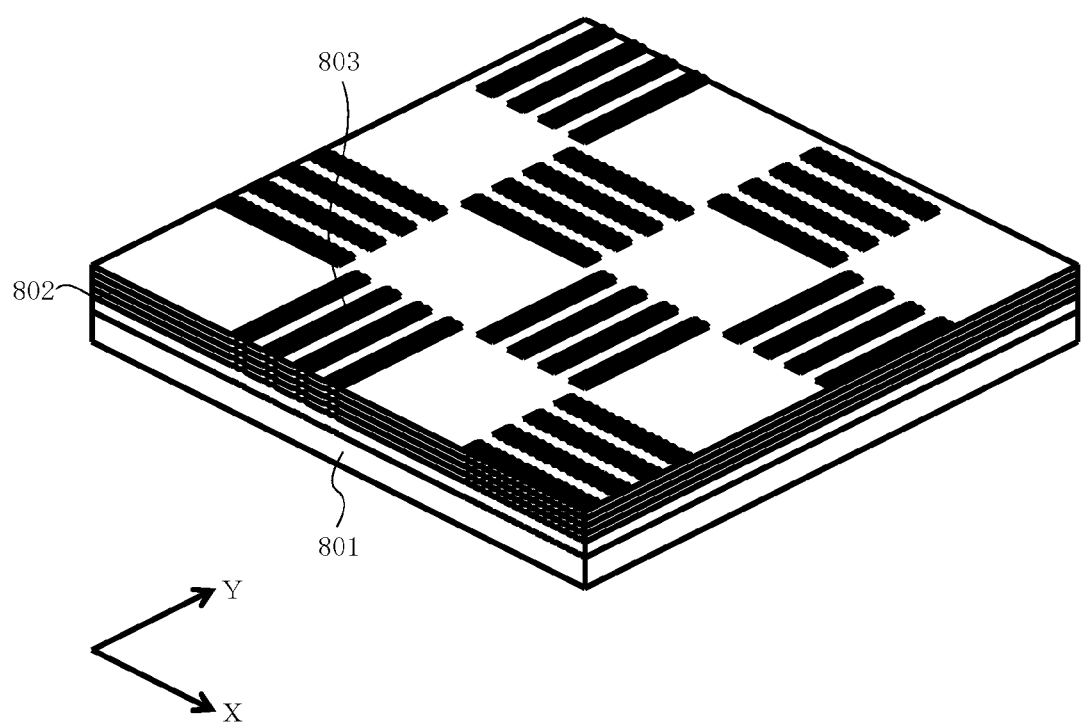
FIG. 8 is a perspective view showing another configuration example of polarization beam splitter layer 109 in FIG. 1.
Figure 9:
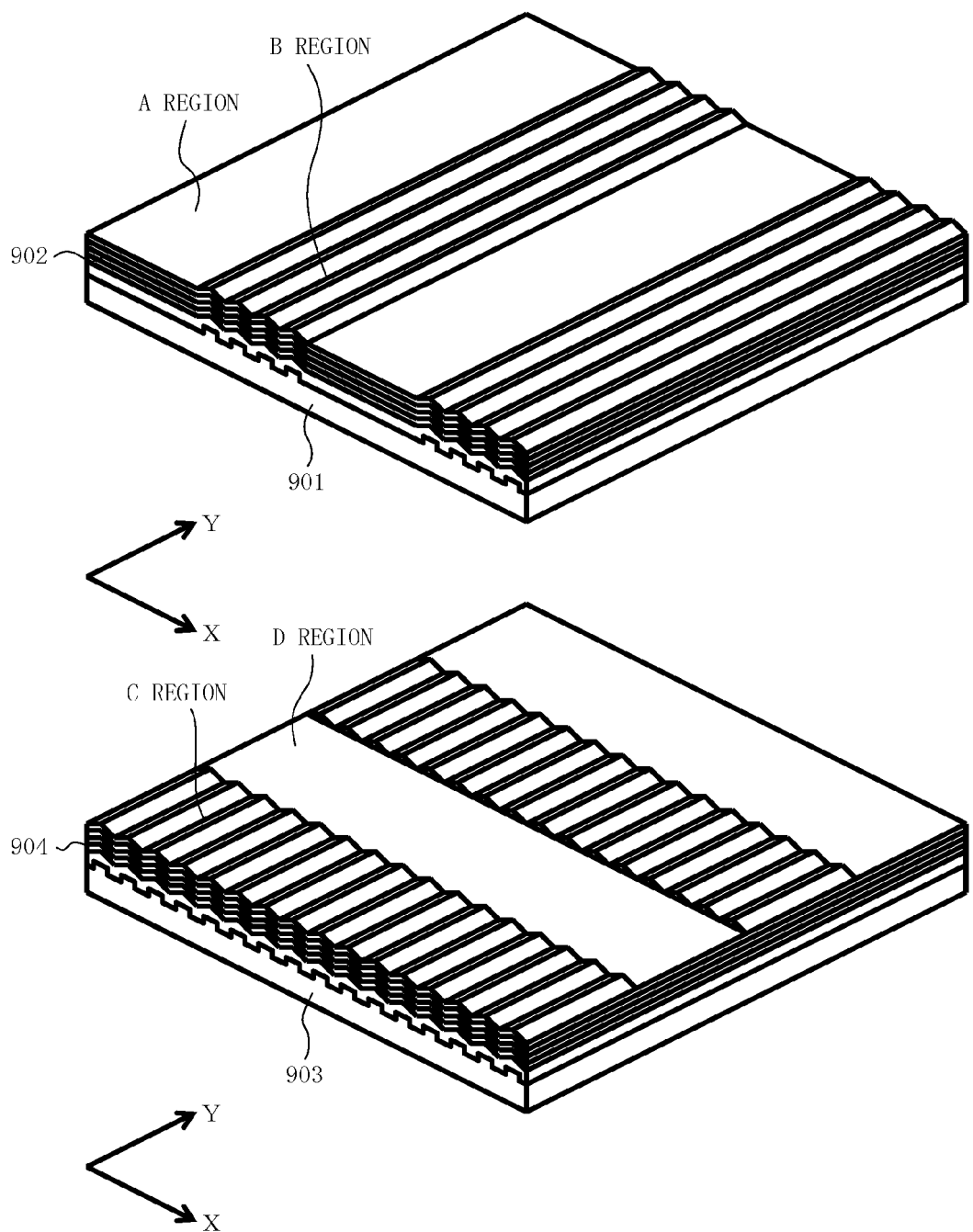
FIG. 9 is a perspective view showing another configuration example of polarization beam splitter layer 109 in FIG. 1.

FIG. 8 is a perspective view showing another configuration example of polarization beam splitter layer 109 in FIG. 1, and FIG. 9 is a perspective view showing the configuration more specifically.

In the example shown in FIGS. 8 and 9, dielectric 802 in which $SiO_2$ and $TiO_2$ are alternately stacked is formed on substrate 801 which is made of quartz. A flat portion where polarizing diffraction grating 803 is not provided as shown in FIG. 8 corresponds to the reflection section of reflection layer 108, and the portion where polarizing diffraction grating 803 is provided corresponds to the exiting section of reflection layer 108. Polarizing diffraction grating 803 includes gratings whose orientation is Y direction and X direction.

FIG. 9 is an enlarged view of a portion where polarizing diffraction grating 803 is provided. Among polarizing diffraction gratings 803, those whose orientation is Y direction are configured such that dielectric 902 in which $SiO_2$ and $TiO_2$ are alternately stacked is formed on substrate 901 which is made of quartz. Polarizing diffraction grating 803 is alternately provided with an A region which is formed into a flat shape, and a B region which has a periodic concavo-convex shape in one direction and a uniform shape in the direction orthogonal to the one direction with respect to the XY plane as disclosed in JP2001-51122A, and works as a polarization-dependent phase diffraction grating. Further, among polarizing diffraction grating 803, those whose orientation is X direction are configured such that dielectric 904 in which $SiO_2$ and $TiO_2$ are alternately stacked is formed on substrate 903 which is made of quartz. Polarizing diffraction grating 803 is alternately provided with a D region which is formed into a flat shape, and a C region which has a periodic structure having a periodic concavo-convex shape in one direction and a uniform shape in the direction orthogonal to the one direction with respect XY plane as disclosed in JP2001-51122A, and works as a polarization-dependent phase diffraction grating.

Figure 10:
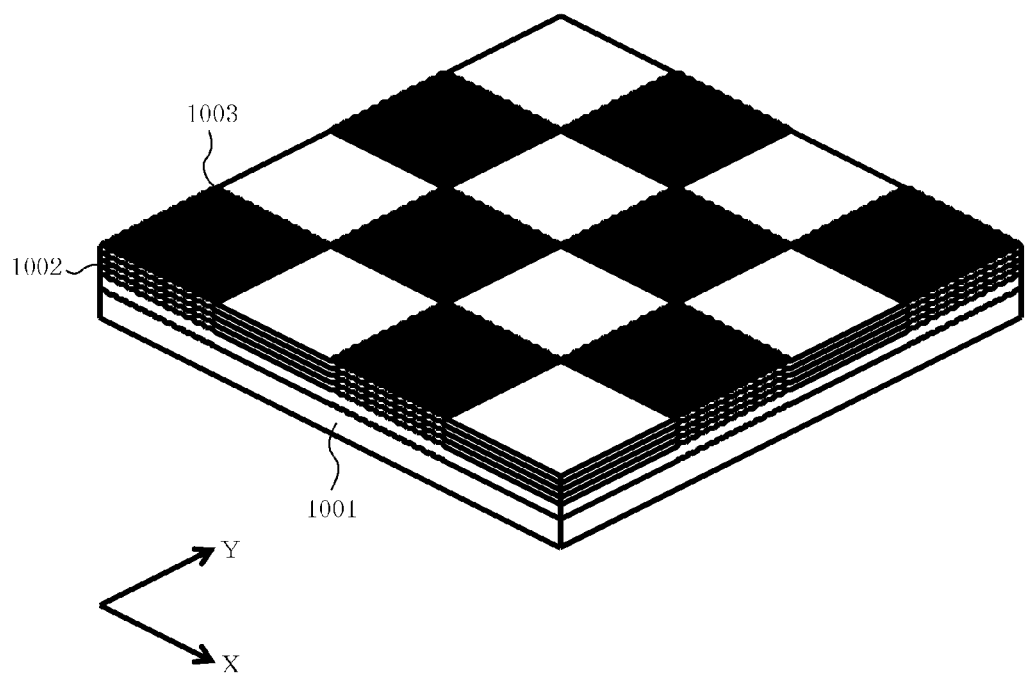
FIG. 10 is a perspective view showing another configuration example of half-wave plate layer 110 in FIG. 1.
Figure 11:
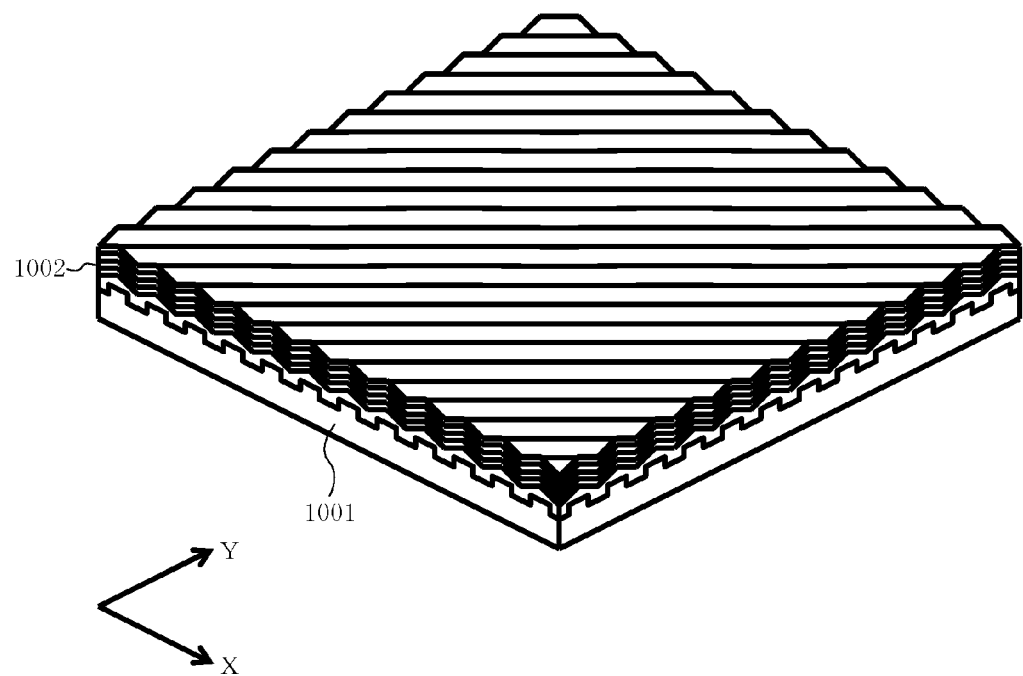
FIG. 11 is a perspective view showing another configuration example of half-wave plate layer 110 in FIG. 1.

FIG. 10 is a perspective view showing another configuration example of half-wave plate layer 110 in FIG. 1, and FIG. 11 is a perspective view showing the configuration more specifically.

In the example shown in FIGS. 10 and 11, dielectric 1002 in which $SiO_2$ and $TiO_2$ are alternately stacked is formed on substrate 1001 which is made of quartz. The portion where half-wave plate 1003 is provided as shown in FIG. 10 corresponds to the reflection section of reflection layer 108, and the flat portion where half-wave plate 1003 is not provided corresponds to the exiting section of reflection layer 108. FIG. 11 is an enlarged view of a portion where half-wave plate 1003 is provided. Half-wave plate 1003 has a periodic structure having a concavo-convex shape in one direction and a uniform shape in the direction orthogonal to the one direction with respect to XY plane as disclosed in JP2001-51122A.

As shown in FIGS. 2 to 6, when reflection member 202, polarizing diffraction grating 303, and half-wave plate 503 are arranged in a striped pattern, it is possible to facilitate the fabrication of the elements.

As shown in FIGS. 7 to 11, when reflection member 702, polarizing diffraction grating 803, and half-wave plate 1003 are arranged in a staggered pattern, the way in which light spreads in the X direction becomes similar to the way in which light spreads in Y the direction so that it is possible to achieve a illumination light which has a high uniformity and is easier to handle.

Figure 12:
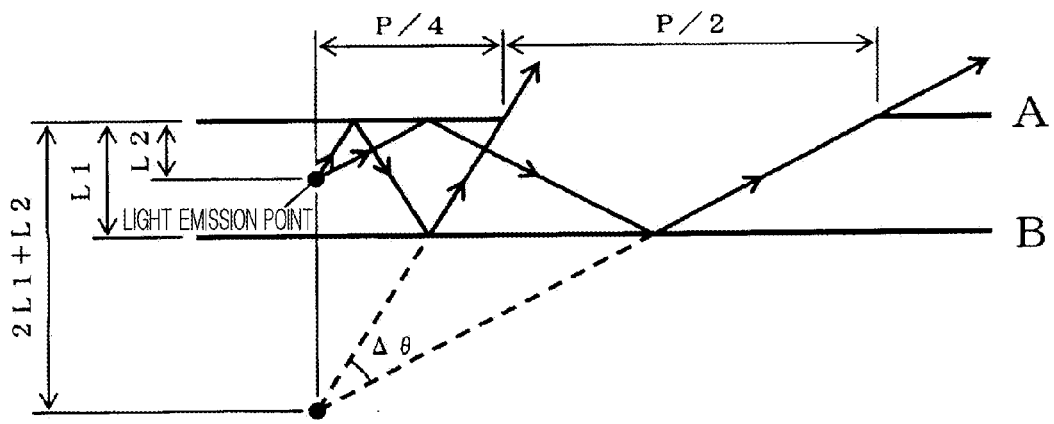
FIG. 12 is a diagram to illustrate the periods of reflection members formed in reflection layer 108, a polarizing diffraction grating formed in polarization beam splitter layer 109, and a half-wave plate formed in half-wave plate layer 110.

FIG. 12 is a diagram to illustrate the periods of a reflection member formed in reflection layer 108, a polarizing diffraction grating formed in polarization beam splitter layer 109, and a half-wave plate formed on half-wave plate layer 110.

Although it is desired that the light generated at active layer 105 directly exit from polarizer layer 108 without being reflected, one half of the light is reflected. When the light is reflected multiple times, since it is greatly attenuated and is difficult to be used as illumination light, herein, a periodical structure will be studied, which is suitable for causing the light to be reflected once at reflection layer 103 and exit from polarizer layer 108.

In FIG. 12, the center of polarizer layer 108 in its thickness direction is denoted by A, the center of reflection layer 103 in its thickness direction is denoted by B, and assuming that the widths of the first region and the second region are the same, the sum of the widths of each region is denoted by P. Further, it is assumed that points at which reflection occurs are centers of polarizer layer 108 and reflection layer 103 in respective thickness directions, and the distance between the points is denoted by L1, and the distance from the center (light emission point) of active layer 105 to the center of polarizer layer 108 is denoted by L2. Furthermore, it is assumed that the position of the light emission point in the XY plane is the center of either the first region or the second region where it is most difficult for light to exit after being reflected once.

As shown in FIG. 12, from among the lights that are generated at the light emission point and that exit after being reflected once, the amount of the light that exits after being reflected once increases as angular width $\Delta\theta$, which is the angle formed between the light that exits at the shortest distance and the light that exits at a longest distance, becomes larger. The intersection of each of the exiting lights is at a distance of 2L1+L2 from center A of polarizer layer 108.

Figure 13:
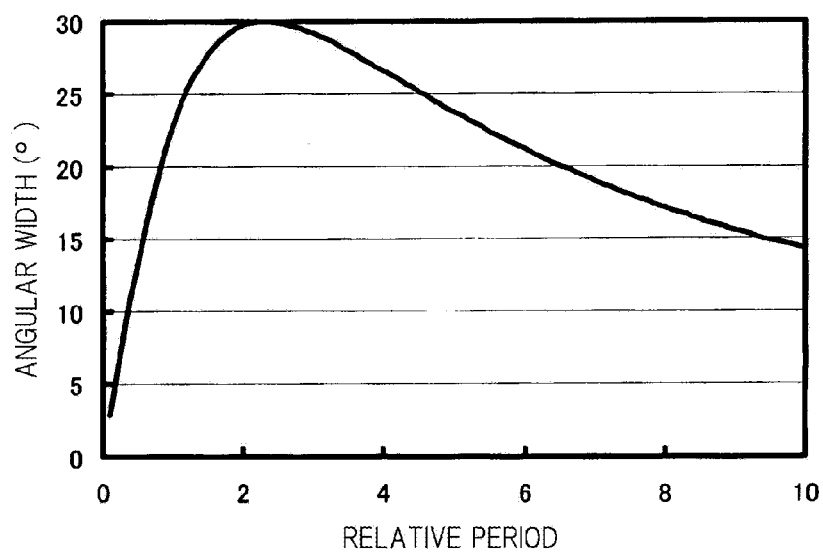
FIG. 13 is a diagram showing the relationship between a relative period and an angular width.

FIG. 13 is a diagram showing the relationship between a relative period, which is shown by P/(2L1+L2), and an angular width, in which it is shown that when the relative period is 2.3, the angular width becomes a maximum of 30°. Further, it is seen that the angular width may be not less than 20° if the relative period is in a range from 0.9 to 6.5, and the angular width may be not less than 25° if the relative period is in a range from 1.2 to 4.5.

When distance L1 between polarizer layer 108 and reflection layer 103 is 3 μm and distance L2 from the center of active layer 105 to the center of polarizer layer 108 is 1.5 μm, in order to get the maximum angular width of 30°, width P which is the sum of the widths of the first region and the second region, may be set to be 17 μm.

Figure 14:
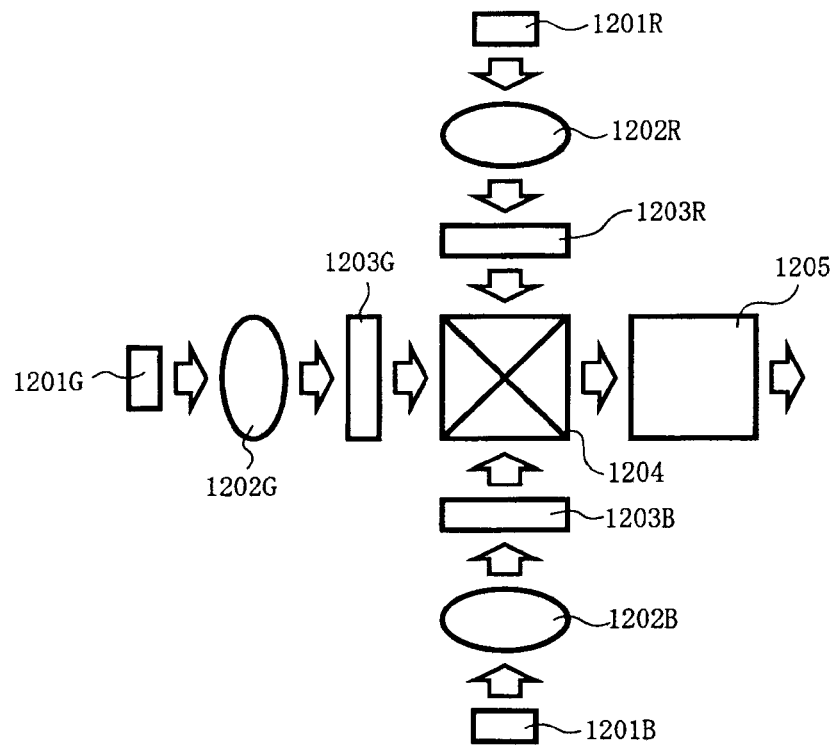
FIG. 14 is a block diagram showing the configuration of one exemplary embodiment of an image display apparatus using a light emitting element according to the present invention.

FIG. 14 is a block diagram showing the configuration of one exemplary embodiment of an image display apparatus using a light emitting element.

An image display apparatus shown in FIG. 14 includes light source unit 1201R that generates a red light, light source unit 1201G that generates a green light, and light source unit 1201B that generates a blue light. Each of these light source units is constructed by using at least one or more of the light emitting elements according to the present invention, which have been described by using FIGS. 1 to 13.

The red light generated at light source unit 1201R irradiates liquid crystal display element 1203R that displays an image for red light, via condenser lens 1202R so that a red image light generated at liquid crystal display element 1203R enters into color synthesis prism 1204.

The green light generated at light source unit 1201G irradiates liquid crystal display element 1203G that displays an image for green light, via condenser lens 1202G so that a green image light generated at liquid crystal display element 1203G enters into color synthesis prism 1204.

The blue light generated at light source unit 1201B irradiates liquid crystal display element 1203B that displays an image for blue light, via condenser lens 1202B so that a blue image light generated at liquid crystal display element 1203B enters into color synthesis prism 1204.

An image light which is synthesized from the entered red image light, green image light, and blue image light at color synthesis prism 1204 is projected via projection lens 1205.

Figure 15:
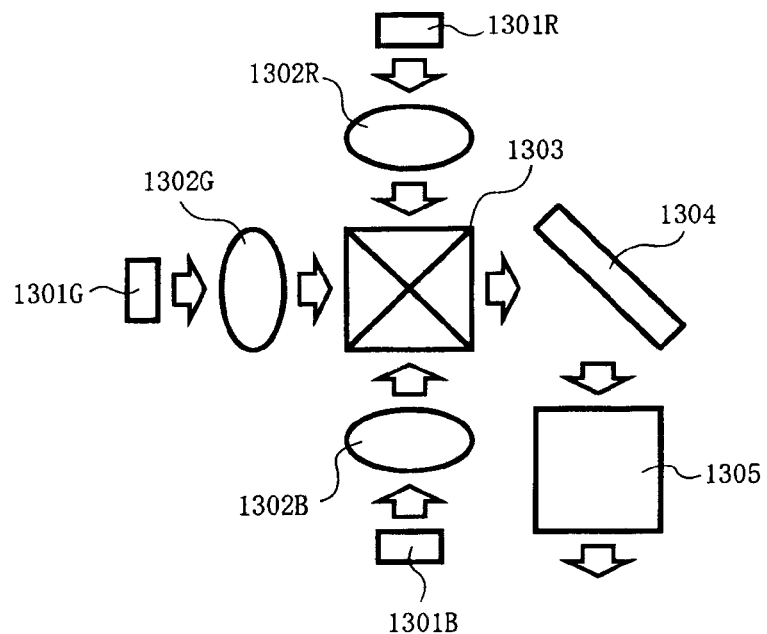
FIG. 15 is a block diagram showing the configuration of another exemplary embodiment of the image display apparatus using the light emitting element according to the present invention.

FIG. 15 is a block diagram showing the configuration of another exemplary embodiment of an image display apparatus using a light emitting element. The image display apparatus of the present exemplary embodiment forms an image by using micromirror 1304 that separately controls the angles of multiple micromirrors.

The image display apparatus of the present exemplary embodiment includes light source unit 1301R that generates a red light, light source unit 1301G that generates a green light, and light source unit 1301B that generates a blue light. Each of these light source units is constructed by using at least one or more of the light emitting elements according to the present invention, which have been described by using FIGS. 1 to 13.

The red light generated at light source unit 1301R enters into color synthesis prism 1303 via condenser lens 1302R. The green light generated at light source unit 1301G enters into color synthesis prism 1303 via condenser lens 1302G. The blue light generated at light source unit 1301B enters into color synthesis prism 1303 via condenser lens 1302B.

Light source unit 1301R, light source unit 1301G, and light source unit 1301B are controlled such that the lit-up state thereof is successively changed over so that a red light, a green light, and a blue light are projected in sequence toward micromirror 1304 from color synthesis prism 1303.

Micromirror 1304 forms an image light according to the colored light with which it is irradiated so that a red image light, a green image light, and a blue image light are projected in sequence via projection lens 1305.

Figure 16:
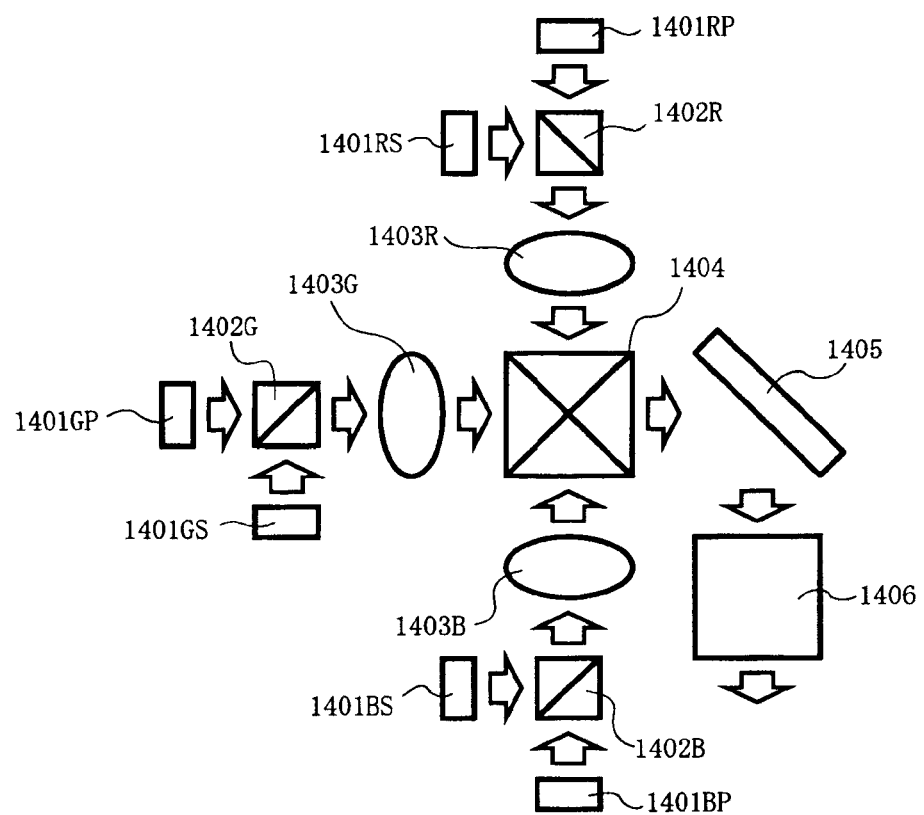
FIG. 16 is a block diagram showing the configuration of another exemplary embodiment of the image display apparatus using the light emitting element according to the present invention.

FIG. 16 is a block diagram showing the configuration of another exemplary embodiment of an image display apparatus using a light emitting element. The image display apparatus of the present exemplary embodiment forms an image by using micromirror 1405 that separately controls the angles of multiple micromirrors.

The image display apparatus of the present exemplary embodiment includes light source units 1401RP and 1401RS that generate P-polarized light and S-polarized light of red color, light source units 1401GP and 1401GS that generate P-polarized light and S-polarized light of green color, and light source units 1401BP and 1401BS that generate P-polarized light and S-polarized light of blue color. Each of these light source units is constructed by using at least one or more of the light emitting elements according to the present invention, which have been described by using FIGS. 1 to 13.

The P-polarized light and S-polarized light of red color which are generated at light source units 1401RP and 1401RS enter into polarization beam splitter 1402R. Polarization beam splitter 1402R transmits the P-polarized light as is, and reflects the S-polarized light. As a result, the P-polarized light and S-polarized light of the red color which are generated at light source units 1401RP and 1401RS are made to exit from polarization beam splitter 1402R.

Similarly, the P-polarized light and S-polarized light of green color which are generated at light source units 1401GP and 1401GS are caused to exit by polarization beam splitter 1402G, and the P-polarized light and S-polarized light of blue color which are generated at light source units 1401BP and 1401BS are caused to exit by polarization beam splitter 1402B.

The lights exited from polarization beam splitter 1402R, polarization beam splitter 1402G, and polarization beam splitter 1402B enter into color synthesis prism 1404 via condenser lenses 1403R, 1403G, and 1403B, respectively.

Light source units 1401RP and 1401RS, light source units 1401GP and 1401GS, and light source units 1401BP and 1401BS are controlled such that the lit-up state of each color is successively changed so that a red light, a green light, and a blue light are projected in sequence toward micromirror 1405 from color synthesis prism 1404.

Micromirror 1405 forms an image light according to the colored light with which it is irradiated so that a red image light, a green image light, and a blue image light are projected in sequence via projection lens 1406.

In the image display apparatus of the present exemplary embodiment compared with the image display apparatus shown in FIG. 15, if the number of light emitting elements that constitute each light source unit is the same, the quantity of light is doubled thus enabling a high luminance.

Figure 17:
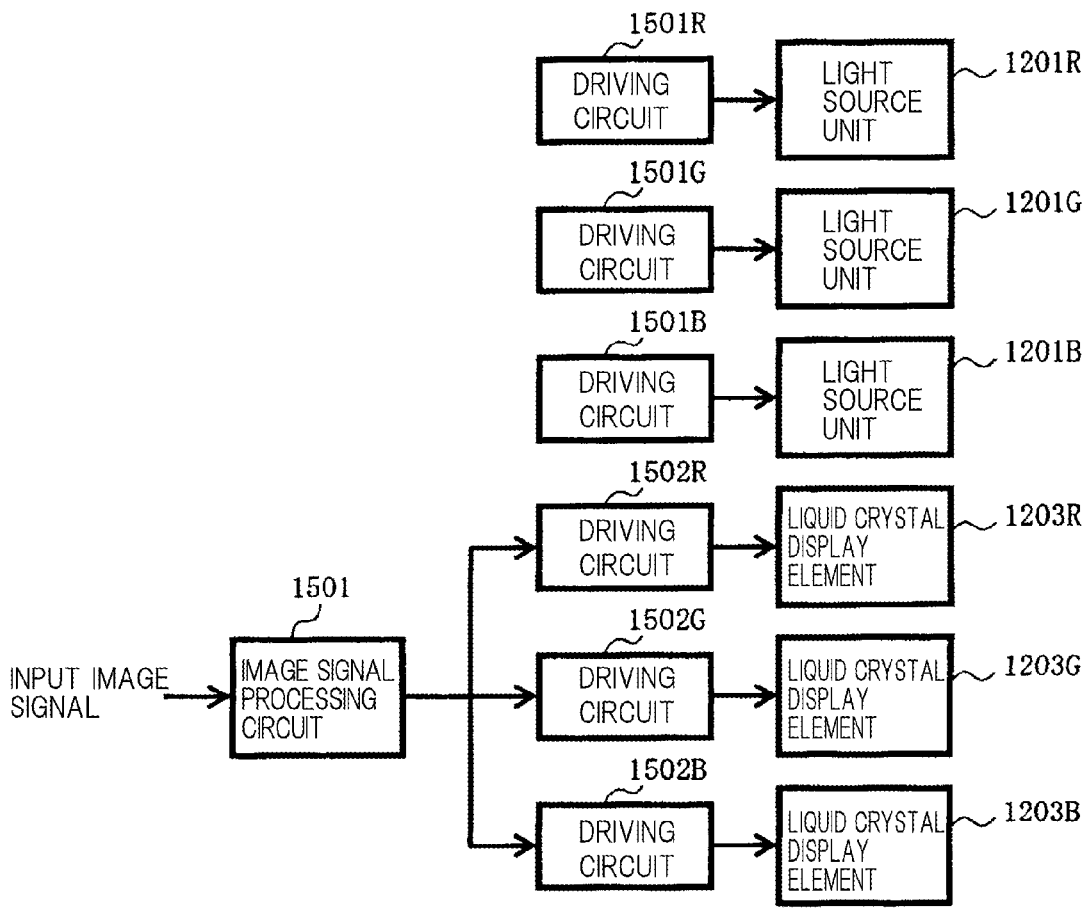
FIG. 17 is a diagram showing the configuration of a driving system of the image display apparatus shown in FIG. 14.

FIG. 17 is a diagram showing the configuration of a driving system of the image display apparatus shown in FIG. 14.

Light source units 1201R, 1201G, and 1201B are turned on into a lit-up state by being driven by driving circuits 1501R, 1501G, and 1501B. It is noted that since light source units 1201R, 1201G, and 1201B are always kept in a lit-up state during image display operation, they may be driven by a single driving circuit.

Image signal processing circuit 1501 creates signals indicating an image for red color, image for green color, and image for blue color according to input image signals provided from an external PC (personal computer) and an image reproducing apparatus, etc. to supply them to driving circuits 1502R, 1502G, and 1502B, and liquid crystal display apparatuses 1203R, 1203G, and 1203B form an image for red color, image for green color, and image for blue color by being driven by driving circuits 1502R, 1502G, and 1502B.

Figure 18:
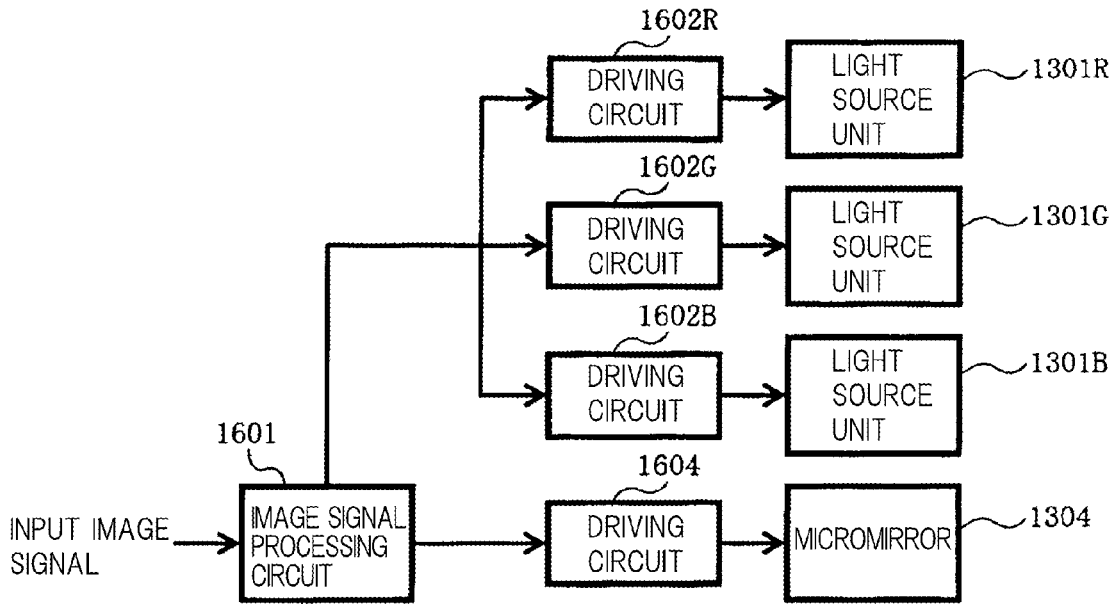
FIG. 18 is a diagram showing the configuration of a driving system of the image display apparatus shown in FIG. 15.

FIG. 18 is a diagram showing the configuration of a driving system of the image display apparatus shown in FIG. 15.

Image signal processing circuit 1601 creates image for red color, image for green color, and image for blue color according to input image signals provided from an external PC and an image reproducing apparatus, etc. to drive micromirror 1304 via driving circuit 1604 such that these images are successively formed. Concurrently with this, driving circuits 1602R, 1602G, and 1602B are controlled such that the light source unit for the image color that has been formed is lit up among light source units 1301R, 1301G, and 1301B.

Figure 19:
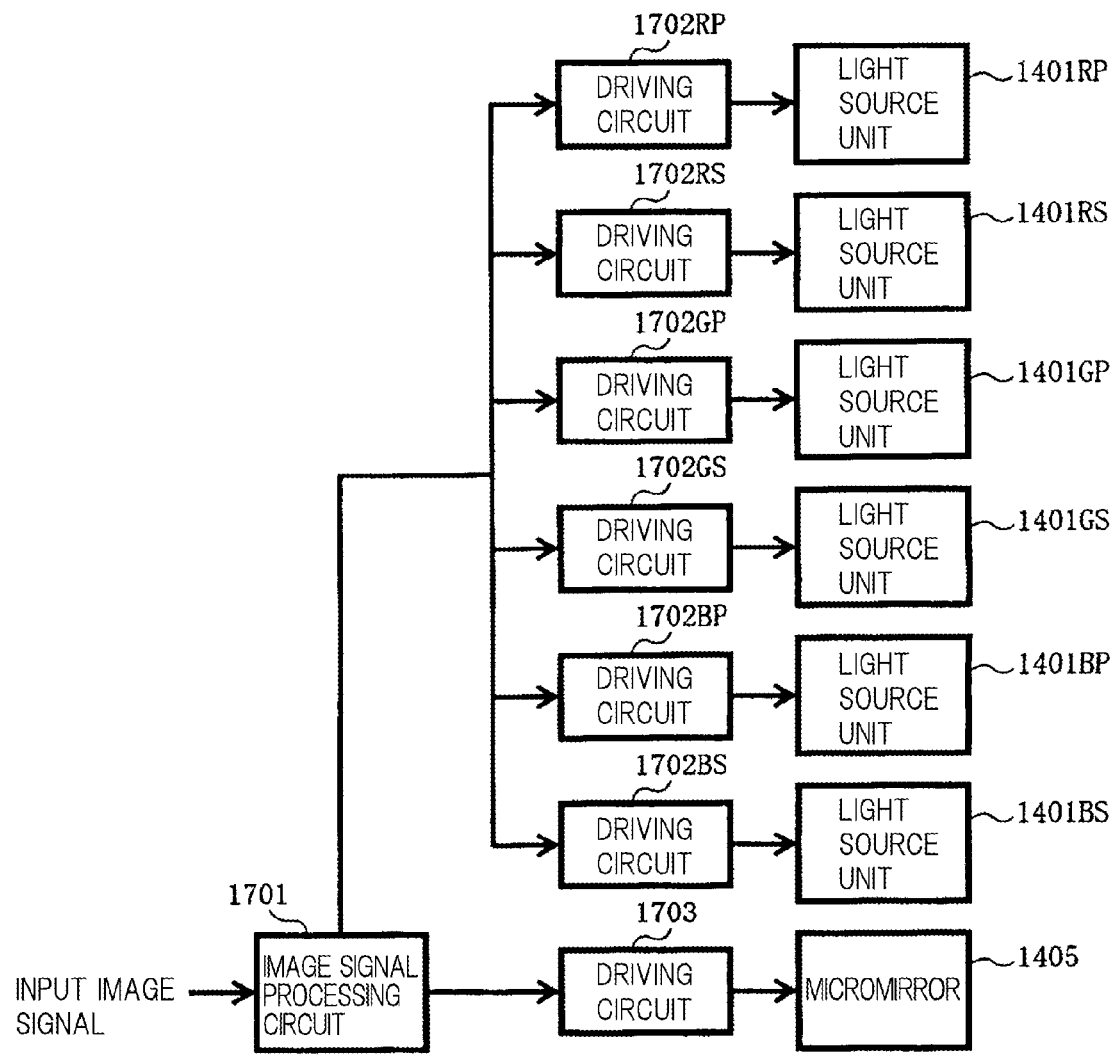
FIG. 19 is a diagram showing the configuration of a driving system of the image display apparatus shown in FIG. 16.

FIG. 19 is a diagram showing the configuration of a driving system of the image display apparatus shown in FIG. 16.

Image signal processing circuit 1701 creates image for red color, image for green color, and image for blue color according to input image signals provided from an external PC and an image reproducing apparatus, etc. to drive micromirror 1405 via driving circuit 1703 such that these images are successively formed. Concurrently with this, driving circuits 1702RP, 1702RS, 1702GP, 1702GS, 1702BP and 1702BS are controlled such that the light source unit for the image color that has been formed is lit up among light source units 1401RP, 1401RS, 1401GP, 1401GS, 1401BP, and 1401BS.

It is noted that as the configuration of an exemplary embodiment of a light emitting element, a configuration in which a quarter-wave plate layer is provided in place of half-wave plate layer 110 is also possible. The quarter-wave plate layer is provided with a quarter-wave plate in the region corresponding to the reflection section of reflection layer 108 and the region corresponding to the exiting section. These quarter-wave plates allow two orthogonal polarized components of incident light to exit after giving a quarter-wave phase difference thereto, in which the quarter-wave plate provided in the region corresponding to the reflection section of reflection layer 108 and the quarter-wave plate provided in the region corresponding to the exiting section respectively give a phase difference of opposite sign to the two orthogonal polarized components of incident light. As described above, since orthogonal linearly polarized lights enter the quarter-wave plate provided in the region corresponding to the reflection section of reflection layer 108 and the quarter-wave plate provided in the region corresponding to the exiting section, the exiting lights thereof will be aligned with circularly polarized lights which rotate in the same direction.

The present application claims priority of Japanese Patent Application No. 2009-243342 filed on Oct. 22, 2009, which is herein incorporated by reference in its entirety.

REFERENCE SIGNS LIST

100 Light emitting element
101 Submount
102 P-type electrode
103 Reflection layer
104 P-type semiconductor layer
105 Active layer
106 N-type semiconductor layer
107 N-type electrode
108 Reflection layer
109 Polarization beam splitter layer
110 Half-wave plate layer

The invention claimed is:
1. A light emitting element including an active layer for generating light, the light emitting element comprising:

a first reflection layer that allows the light generated at said active layer to reflect at a reflection section in which reflection members are periodically provided, and to exit from an exiting section between the reflection members;

a polarization beam splitter layer that transmits a polarized light oriented in a first direction and diffracts a polarized light oriented in a second direction orthogonal to the first direction among the light exited from said exiting section;

a wave plate layer that allows the light transmitted through said polarization beam splitter layer and the light diffracted at said polarization beam splitter layer to enter, and to exit as light having a same polarization state; and a second reflection layer that reflects the light reflected at said first reflection layer.

2. The light emitting element according to claim 1, wherein said reflection section is adjacently disposed in a striped pattern.

3. The light emitting element according to claim 1, wherein said reflection section is adjacently disposed in a staggered pattern.

4. The light emitting element according to claim 1, wherein within said wave plate layer, a portion that allows the light transmitted through said polarization beam splitter layer to enter, and a portion that allows the light diffracted at said polarization beam splitter layer to enter, allow an incident light to exit after respectively giving a different polarization rotation angle thereto.

5. The light emitting element according to claim 1, wherein within said wave plate layer, a portion that allows the light transmitted through said polarization beam splitter layer to enter, and a portion that allows the light diffracted at said polarization beam splitter layer to enter, allow two orthogonal polarized components of an incident light to exit as a circularly polarized light after respectively giving a different phase difference thereto.

6. The light emitting element according to claim 1, wherein letting P be a period of said reflection members, L1 be a distance between a center in thickness direction of the first reflection layer and a center in thickness direction of the second reflection layer, and L2 be a distance from a center in thickness direction of the active layer to the center of the first reflection layer, $P/(2L1+L2)$ is within from 0.9 to 6.5.

7. The light emitting element according to claim 6, wherein $P/(2L1+L2)$ is within from 1.2 to 4.5.

8. The light emitting element according to claim 6, wherein $P/(2L1+L2)$ is 2.3.

9. An image display apparatus using the light emitting element according to claim 1.

* * * * *